(12) United States Patent
Kim

(10) Patent No.: US 9,368,356 B2
(45) Date of Patent: Jun. 14, 2016

(54) METHOD FOR FABRICATING ELECTRONIC DEVICES HAVING SEMICONDUCTOR MEMORY UNIT

(71) Applicant: SK hynix Inc., Icheon-Si (KR)

(72) Inventor: Jung-Nam Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 31 days.

(21) Appl. No.: 14/146,659

(22) Filed: Jan. 2, 2014

(65) Prior Publication Data

US 2014/0256103 A1 Sep. 11, 2014

(30) Foreign Application Priority Data

Mar. 5, 2013 (KR) .................. 10-2013-0023157

(51) Int. Cl.
| | |
|---|---|
| *H01L 21/283* | (2006.01) |
| *H01L 29/417* | (2006.01) |
| *H01L 29/423* | (2006.01) |
| *H01L 29/66* | (2006.01) |
| *H01L 45/00* | (2006.01) |
| *H01L 27/24* | (2006.01) |
| *H01L 21/768* | (2006.01) |
| *H01L 21/285* | (2006.01) |
| *H01L 29/78* | (2006.01) |
| *H01L 29/08* | (2006.01) |

(52) U.S. Cl.
CPC ........ *H01L 21/283* (2013.01); *H01L 21/28518* (2013.01); *H01L 21/76897* (2013.01); *H01L 27/2436* (2013.01); *H01L 27/2463* (2013.01); *H01L 29/41783* (2013.01); *H01L 29/4236* (2013.01); *H01L 29/665* (2013.01); *H01L 29/66621* (2013.01); *H01L 45/06* (2013.01); *H01L 45/08* (2013.01); *H01L 45/1233* (2013.01); *H01L 45/141* (2013.01); *H01L 45/146* (2013.01); *H01L 45/147* (2013.01); *H01L 45/16* (2013.01); *H01L 29/0847* (2013.01); *H01L 29/78* (2013.01)

(58) Field of Classification Search
USPC .................................................. 438/270, 589
See application file for complete search history.

(56) References Cited

U.S. PATENT DOCUMENTS

| | | | |
|---|---|---|---|
| 2007/0004128 A1* | 1/2007 | Jung .............................. | 438/243 |
| 2012/0074518 A1* | 3/2012 | Kim et al. ..................... | 257/506 |
| 2012/0086074 A1* | 4/2012 | Hwang et al. ................. | 257/334 |
| 2012/0139028 A1* | 6/2012 | Park et al. ..................... | 257/324 |
| 2013/0170281 A1* | 7/2013 | Song et al. .................... | 365/148 |
| 2013/0193549 A1* | 8/2013 | Lee ................................ | 257/508 |
| 2013/0320436 A1* | 12/2013 | Kim .............................. | 257/330 |
| 2014/0001525 A1* | 1/2014 | Kajiyama ..................... | 257/295 |
| 2014/0254239 A1* | 9/2014 | Song et al. .................... | 365/148 |

FOREIGN PATENT DOCUMENTS

| | | |
|---|---|---|
| KR | 10-2010-0078964 A | 7/2010 |
| KR | 1061321 B1 | 8/2011 |
| KR | 10-2003-0003370 A | 1/2013 |

* cited by examiner

*Primary Examiner* — Brett Feeney
*Assistant Examiner* — Erik T Peterson
(74) *Attorney, Agent, or Firm* — Perkins Coie LLP

(57) ABSTRACT

Devices and methods based on disclosed technology include, among others, an electronic device including silicide layers capable of effectively reducing contact resistance in the electronic device including buried gates and a method for fabricating the electronic device. Specifically, an electronic device in one implementation includes a plurality of buried gates formed in a substrate and silicide layers formed over the substrate between the buried gates and protruding upwardly from the buried gates.

12 Claims, 14 Drawing Sheets

(실시예 1)

(변형예 1)

(변형예 2)

(변형예 3)

METHOD FOR FABRICATING ELECTRONIC DEVICES HAVING SEMICONDUCTOR MEMORY UNIT

CROSS-REFERENCE TO RELATED APPLICATION

The present application claims priority of Korean Patent Application No. 10-2013-0023157, entitled "SEMICONDUCTOR DEVICE AND METHOD FOR MANUFACTURING THE SAME, AND MICRO PROCESSOR, PROCESSOR, SYSTEM, DATA STORAGE SYSTEM AND MEMORY SYSTEM INCLUDING THE SEMICONDUCTOR DEVICE" and filed on Mar. 5, 2013, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which may store data using a characteristic switched between different resistance states according to an applied voltage or current, and can be implemented in various configurations, for example, resistive random access memory (RRAM), phase-change random access memory (PRAM), ferroelectric random access memory (FRAM), magnetic random access memory (MRAM), an E-fuse, etc.

SUMMARY

The disclosed technology in this patent document includes memory circuits or devices and their applications in electronic devices or systems and various implementations of an electronic device using a semiconductor device including silicide layers capable of effectively reducing contact resistance in the semiconductor device including buried gates and a method for fabricating the semiconductor device.

In one aspect, a method for fabricating an electronic device is provided to include a semiconductor memory unit that includes: forming a plurality of trenches in a substrate, forming conductive layers each burying part of the trench, forming sealing layers each burying the remaining trench, projecting the substrate between the sealing layers by recessing the sealing layers, and changing the projected substrates into silicide layers.

In another aspect, a method for fabricating an electronic device is provided to include a semiconductor memory unit that includes: forming isolation layers to define active regions in a substrate including silicon, forming a plurality of trenches in the substrate, forming gate electrodes each burying each of the trenches, forming sealing layers each burying the remaining trench, projecting the substrate of the active regions by recessing the sealing layers and the isolation layers, and changing the projected substrates into silicide layers.

In another aspect, an electronic device may be provided to include a semiconductor memory unit that includes: a plurality of buried gates formed in a substrate and silicide layers formed over the substrate between the buried gates and protruded upwardly from the buried gates.

In another aspect, a method is provided for fabricating an electronic device having a semiconductor memory unit to include forming a plurality of trenches in a substrate; forming conductive layers, each burying part of the trench; forming sealing layers, each burying the remaining trench; and forming silicide layers above the substrate to be located between the sealing layers and to protrude above the sealing layers.

In another aspect, a method for fabricating an electronic device having a semiconductor memory unit is provided to include forming isolation layers to define active regions in a substrate; forming a plurality of trenches in the substrate; forming gate electrodes, each burying each of the trenches; forming sealing layers, each burying the remaining trench; recessing the sealing layers and the isolation layers to produce protruded portions in the substrate of the active regions; and transforming the protruded portions into silicide layers.

In another aspect, a method for fabricating an electronic device having a semiconductor memory unit is provided to include forming a plurality of buried gates in a substrate having a plurality of active regions defined by isolation layers, each buried gates including trenches, gate electrodes and sealing layers; forming impurity regions in the active regions between the buried gates by implanting ion impurities to the substrate; and forming silicide layers on the impurity regions and between the buried gates to provide an increased contact area between the substrate and contact holes.

In another aspect, an electronic device may be provided to include a semiconductor memory unit that includes: word lines configured to comprise a plurality of buried gates formed in a substrate, impurity regions formed in the substrate between the buried gates, silicide layers formed on the impurity regions between the buried gates and protruded upwardly from the buried gates, a source line coupled with the silicide layer on a first side of the buried gate, a variable resistance element coupled with the silicide layer on a second side of the buried gate through a contact plug, and bit lines each coupled with the variable resistance element.

In another aspect, a microprocessor may include: a control unit configured to receive a signal including a command from an outside, and performs extraction, decoding, and controlling input and output of the command; an operation unit configured to perform an operation according to a result that the control unit decodes the command; and a memory unit configured to store at least one of data for performing the operation, data corresponding to a result of performing the operation, and an address of data for which the operation is performed, the memory unit including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In another aspect, a processor may include: a core unit configured to perform, according to a command inputted from an outside, an operation corresponding to the command, by using data; a cache memory unit configured to store at least one of data for performing the operation, data corresponding to a result of performing the operation, and an address of data for which the operation is performed; and a bus interface connected between the core unit and the cache memory unit, and configured to transmit data between the core unit and the cache memory unit, the cache memory unit including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In another aspect, a system may include: a processor configured to decode a command inputted from an outside and control an operation for information according to a result of decoding the command; an auxiliary memory device configured to store a program for decoding the command and the information; a main memory device configured to call and store the program and the information from the auxiliary memory device such that the processor may perform the operation using the program and the information when executing the program; and an interface device configured to perform communication between at least one of the processor, the auxiliary memory device and the main memory device and the outside, at least one of the auxiliary memory device and the main memory device including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In another aspect, a data storage system may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, at least one of the storage device and the temporary storage device including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

In yet another aspect, a memory system may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, at least one of the memory and the buffer memory including: a resistance variable element including a free magnetic layer, a tunnel barrier layer and a pinned magnetic layer; and a magnetic correction layer disposed over the resistance variable element to be separated from the resistance variable element, and having a magnetization direction which is opposite to a magnetization direction of the pinned magnetic layer.

These and other aspects, implementations and associated advantages are described in greater detail in the drawings, the description and the claims.

DETAILED DESCRIPTION

Figure 1:
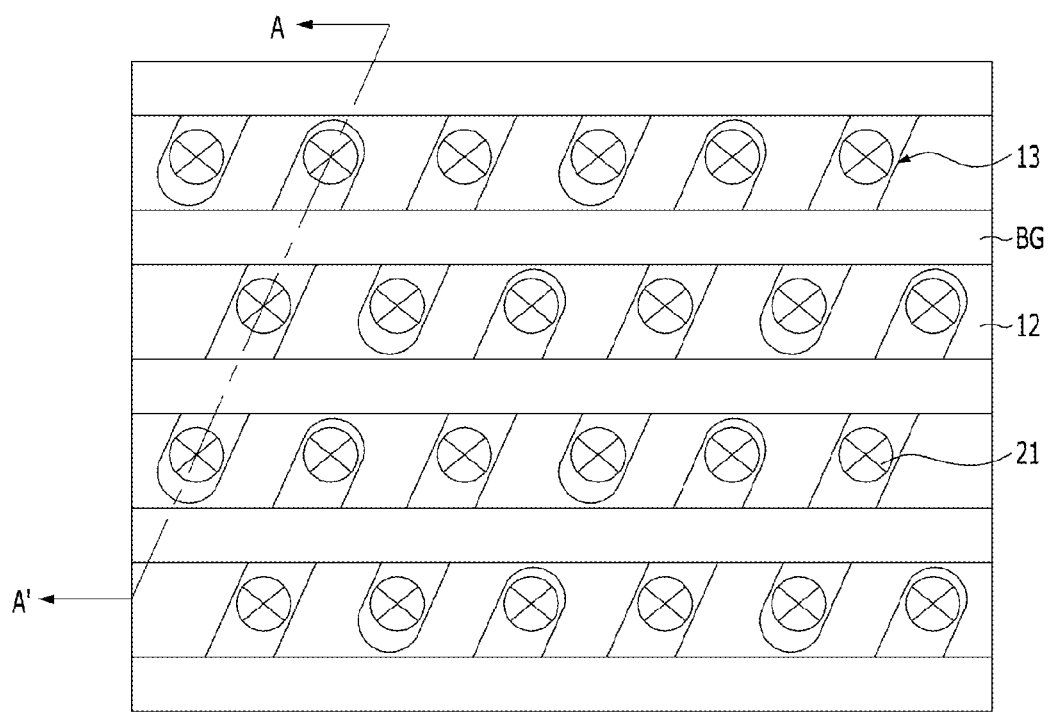
FIG. 1 is a plan view of a semiconductor device including buried gates (BG) arranged between the impurity region and the contact hole region.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations of the disclosed technology in this patent document can be used to provide a semiconductor device including silicide layers and buried gates BG capable of effectively reducing contact resistance in the semiconductor device and a method for fabricating the device. The contact resistance may include resistance between an impurity region, for example, a source region/drain region and a contact plug in contact with the source region/drain region. A silicide layer capable of effectively reducing contact resistance is interposed between the impurity region and the contact plug and may function as an ohmic contact between the impurity region and the contact plug, thereby effectively reducing contact resistance.

For reference, a buried gate structure can be advantageously implemented in a cell architecture having a higher degree of integration than a planar gate (PG) or recess gate (RG) structure and a process of forming contact plugs and a process of forming conductive lines including bit lines and a source line are easier to implement than circuits based on other gate structures. Furthermore, the buried gate structure is advantageous in achieving a simpler structure and a simpler formation process than those for a vertical gate (VG) structure. Accordingly, the availability of the buried gate in various circuits can be beneficial in practical semiconductor or electronic devices.

Figure 2A:
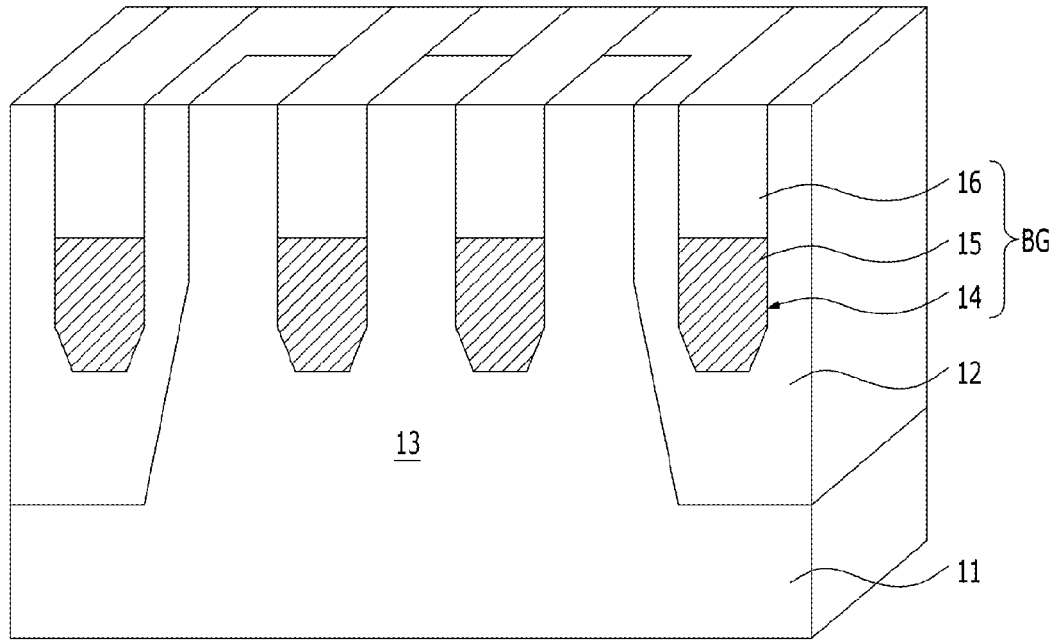
FIGS. 2A to 2D are diagrams showing a process for fabricating the semiconductor device including sections taken along line A-A' in FIG. 1.

A method for fabricating a semiconductor device including buried gates is described below with reference to FIGS. 1 and 2A to 2D. FIG. 1 is a plan view of a semiconductor device including buried gates BG interposed between the impurity regions and the contact hole regions. FIGS. 2A to 2D are process-perspective views illustrating a process for fabricating the semiconductor device including sections taken along line A-A' of FIG. 1. As shown in FIG. 2A, isolation layers 12 are formed in a substrate 11 to define a plurality of active regions 13. The substrate 11 may include silicon-containing materials. For example, the substrate 11 may be a bulk silicon substrate, a support substrate, or a silicon on insulator (SOI) substrate in which a buried insulating layer and a silicon epitaxial (Si Epi.) layer are stacked. The isolation layers 12 may be formed using a shallow trench isolation (STI) process.

A plurality of buried gates BG are formed in the substrate 11. in which the active regions 13 are defined by the isolation layers 12. The buried gates BG may be formed by a series of processes of forming a plurality of trenches 14 by selectively etching the substrate 11, forming gate insulating layers (not shown) on the surfaces of the trenches 14, forming gate electrodes 15, and forming sealing layers 16. Each gate electrode 15 may be configured to bury or fill up part of the trench 14 and sealing layers 16 may be configured to bury or fill up the remaining trench 14 over the gate insulating layers. The gate electrodes 15 may be formed of a metallic layer. The metallic layer may include a conductive layer having metallic elements, a metal layer, a metal oxide layer, a metal nitride layer, and so on. The gate insulating layers and the sealing layers 16 may be formed from an insulating layer, for example, any single layer selected from an oxide layer, a nitride layer, an oxide nitride layer or a stack of those layers.

Figure 2B:
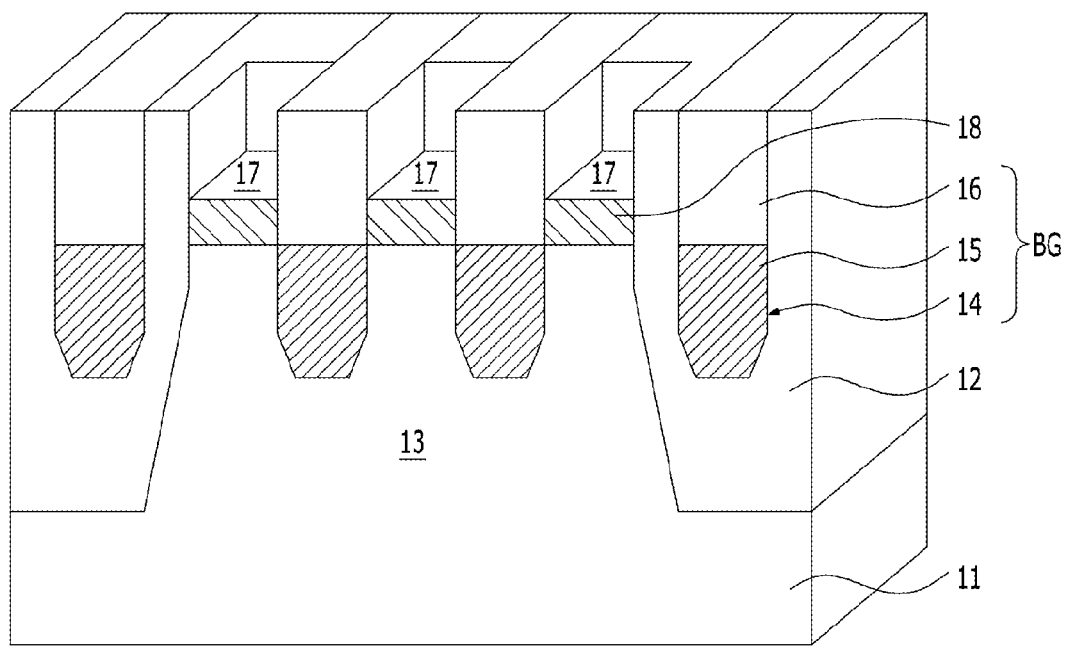

As shown in FIG. 2B, contact holes 17 may be formed by recessing the substrate 11 of the active regions 13 using the isolation layers 12 and the sealing layers 16 as etch barriers. The contact hole 17 provides a space for a contact plug to be formed. The sidewalls of the contact holes 17 are provided by the isolation layers 12 and the sealing layers 16.

Impurity regions 18, for example, source region/drain regions, are formed by implanting ion impurities into the substrate 11 under the contact holes 17. In some implementations, the contact holes 17 may be formed after forming the impurity regions 18 by implanting ion impurities into the substrate 11 of the active regions 13.

Figure 2C:
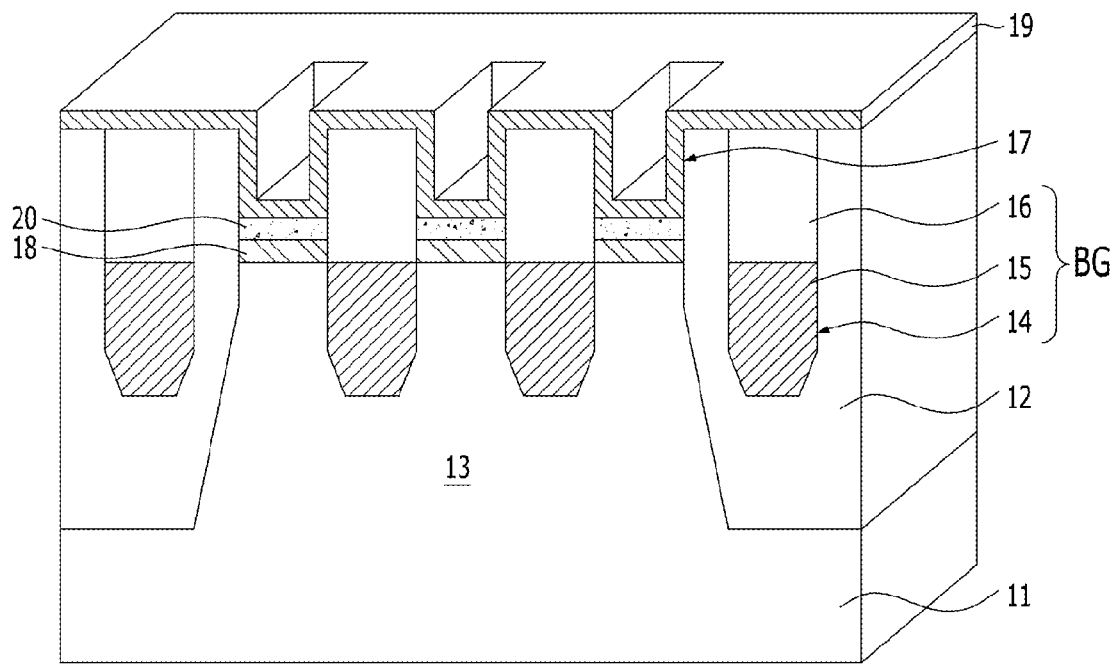

As shown in FIG. 2C, a metal-containing layer 19 may be formed along a surface of the structure including the contact holes 17. Next, silicide layers 20 may be formed between the impurity region 18 and the metal-containing layer 19 under the contact holes 17. Silicide layers 20 may be formed by performing the anneal to react the impurity region 18 with the metal-containing layer 19.

Figure 2D:
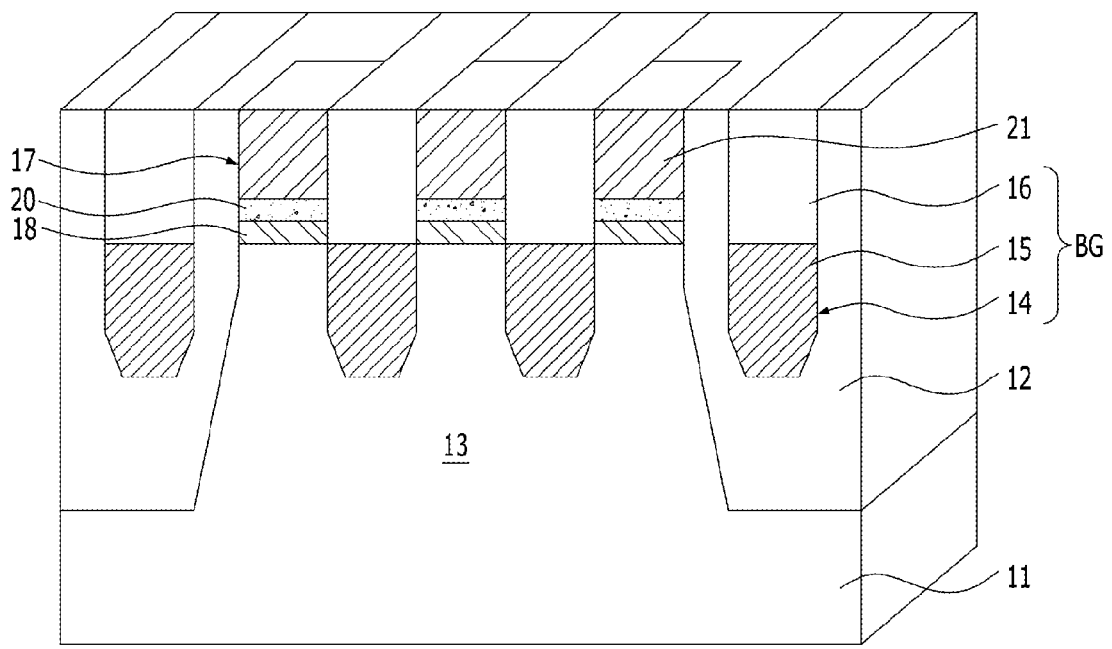

As shown in FIG. 2D, after removing the metal-containing layer 19 that has not reacted, contact plugs 21 are formed by burying or filling in the contact holes 17 with conductive materials.

Referring to FIGS. 1 and 2, the semiconductor device is formed to include the silicide layer 20 that functions as an ohmic contact between the impurity region 18 and the contact plug 21. Thus, the semiconductor device in FIGS. 1 and 2 can compensate for an increase of contact resistance. For practical semiconductor devices, it is desirable to reduce the contact resistance since as a semiconductor device has a high degree of integration, a contact area between the impurity region 18 and the contact plug 21 becomes smaller, which causes the contact resistance of the semiconductor device to increase.

In the semiconductor device of FIGS. 1 and 2, however, there is a limit to the amount of the reduction in the contact resistance since the area of the contact hole 17 formed by etching the sealing layer 16 and the isolation layer 12 (the area of a part of the bottom which is to be exposed in order to form the silicide layer 20) tends to be very narrow. Thus, it is difficult to provide the semiconductor device having the silicide layer 20 with a desired sufficiently small contact resistance In order to provide the semiconductor device having a desired sufficiently small contact resistance, the silicide layer 20 needs to have a sufficient size and thickness, which allows to provide adequate compensation for an increase of the contact resistance caused by the small contact area.

In recognition of the above, the examples of semiconductor devices disclosed below are implemented to increase the contact resistance between impurity regions and contact plugs as the degree of integration of semiconductor devices is increased in the semiconductor device including buried gates and a method for fabricating the semiconductor device.

Figure 3A:
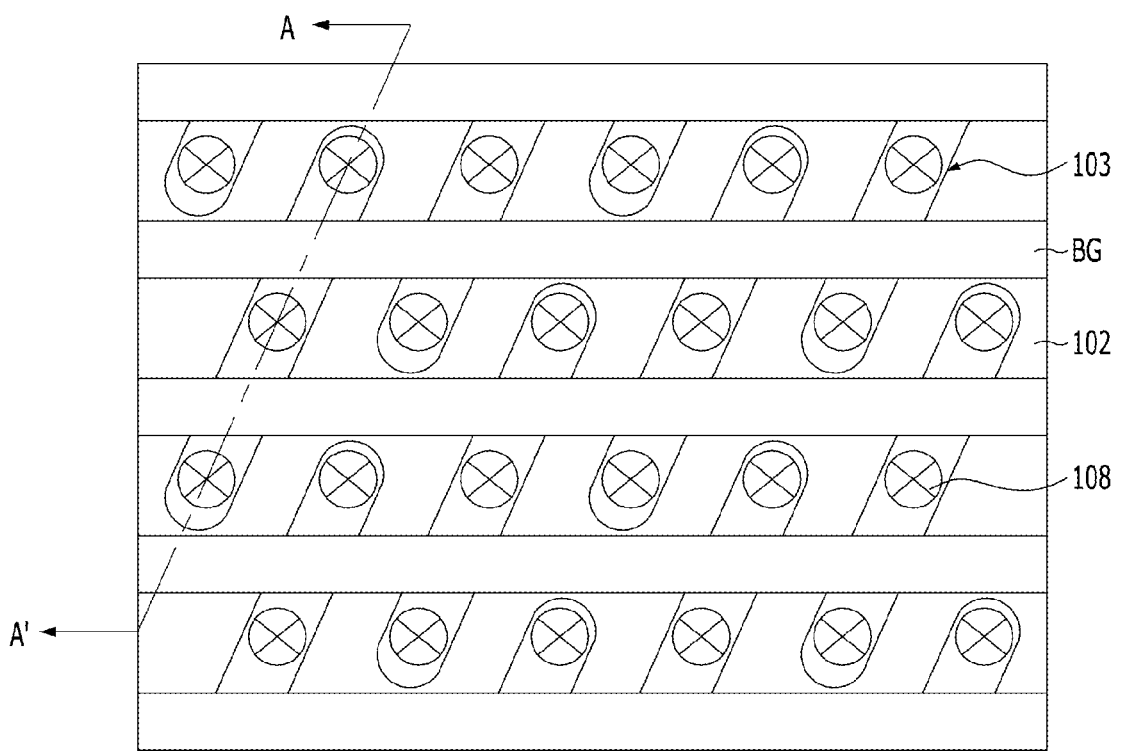
FIGS. 3A to 3C are diagrams showing an example of a semiconductor device including buried gates.
Figure 3B:
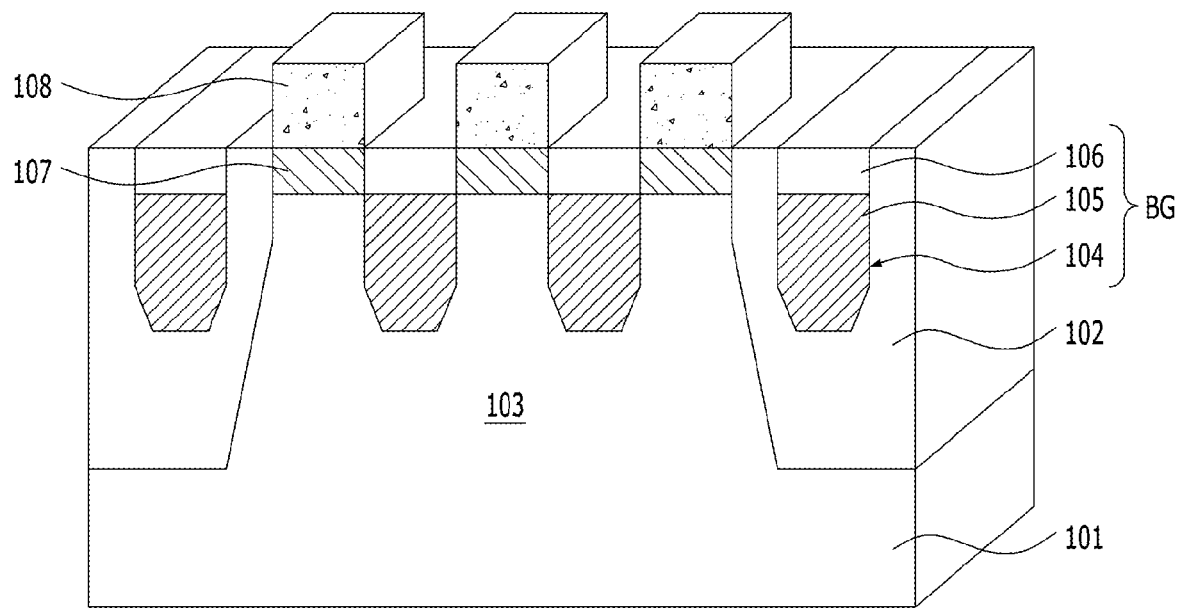
Figure 3C:
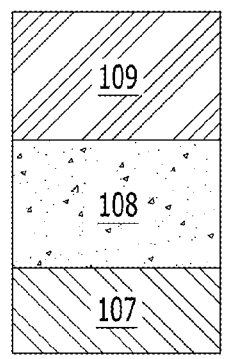
Figure 3C:
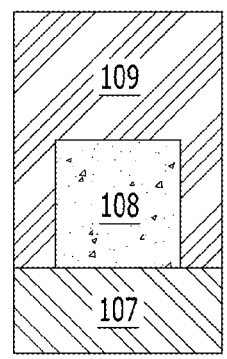
Figure 3C:
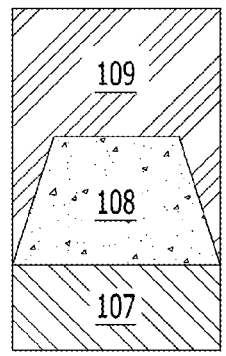
Figure 3C:
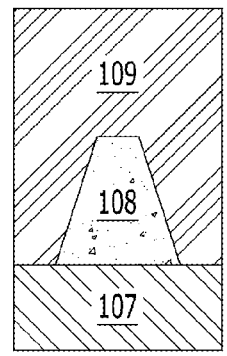

FIGS. 3A to 3C are diagrams showing a semiconductor device including buried gates FIG. 3A is a plan view of an example of the semiconductor device, FIG. 3B is a perspective view of the semiconductor device including a section taken along line A-A' of FIG. 3A, and FIG. 3C are cross-sectional views illustrating modification examples of silicide layer shapes.

As shown in FIGS. 3A to 3C, the semiconductor device may include a plurality of buried gates BG formed in a substrate 101. Referring to FIGS. 3B and 3C, silicide layers 108 are formed over the substrate 101 between the buried gates BG and upwardly protruding from the buried gates BG. Over the silicide layers 108 are the contact plugs 109. In some implementations, the silicide layers 108 can upwardly protrude from the upper part of the buried gates BG and, as illustrated in the specific example in FIGS. 3B and 3C, may upwardly protrude from the top surface of the device. The semiconductor device may further include impurity regions 107 formed in the substrate 101 of an active region 103 between the buried gates BG and contact plugs 109 formed on the silicide layers 108.

Isolation layers 102 are formed in the substrate 101 to define the plurality of active regions 103. The substrate 101 may include silicon-containing materials. For example, the substrate 101 may be any one of a silicon substrate, a silicon germanium substrate, a support substrate, and a silicon on insulator (SOI) substrate. A buried insulating layer and a silicon epitaxial (Si Epi.) layer may be stacked on the substrate 101. The isolation layers 102 may be formed using a shallow trench isolation (STI) process. The isolation layers 102 may be any single layer or a stack layer of two or more layers including an oxide layer, a nitride layer, and an oxide nitride layer The active region 103 defined by the isolation layers 102 may be in various shapes and, for example, may have an obliquely extending shape having a long axis and a short axis.

A trench 104, a gate insulating layer (not shown), a gate electrode 105, and a sealing layer 106 are sequentially formed in the substrate 101 to form a buried gate BG. The gate electrode 105 may be configured to bury part of the trench 104, and a sealing layer 106 may be configured to bury the remaining trench 104. The trench 104 may have a line type pattern that is extended along a direction having an angle with respect to the direction in which the long axis of the active region 103 is extended. The trench 104 may have a shape in which the trench intersects both the active region 103 and the isolation layer 102. The trenches 104 may include first trenches formed in the active regions 103 and second trenches formed in the isolation layers 102. The first trench and the second trench may have the same or different depths. The depth of the second trench may be greater than that of the first trench due to a top surface of the substrate 101. If the depth of the second trench is greater than that of the first trench, driving force (i.e., a gate control capability) of the buried gate BG can be improved because the active region 103 under the gate electrode 105 has a fin shape.

The gate insulating layer may include an oxide layer, a nitride layer, or an oxide nitride layer. The gate electrode 105 may include a silicon layer doped with impurities or a metallic layer. The sealing layer 106 functions to protect the gate electrode 105, and the sealing layer 106 may be any single layer or a stack layer of two or more layers using an oxide layer, a nitride layer, and an oxide nitride layer. The sealing layer 106 may be made of the same materials the isolation layer 102. If the sealing layer 106 is made of the same material as the isolation layer 102, a fabrication process can be simplified.

The impurity region 107 is formed under the silicide layer 108 and between the buried gates BG. The depth of the impurity region 107 may be controlled depending on the characteristics of a device. For example, the bottom of the impurity region 107 may be interfaced with the plane where the gate electrode 105 comes in contact with the sealing layer 106 or may be placed lower than the interfacing plane. The impurity region 107 functions as a junction region such as a source region/drain region. The impurity region 107 may be formed by implanting ion impurities into the substrate 101. The impurities may be N-type impurities such as phosphorous (P) or arsenic (As), or P-type impurities such as boron (B).

The silicide layers 108 function to reduce contact resistance of a device. The silicide layers 108 function to reduce contact resistance that exists between the structures to be coupled with the impurity regions 107. For example, the silicide layers 108 can function to reduce contact resistance exists between the contact plugs 109. If such contact resistance is reduced, there is an advantage in that contact resistance across the entire device can be reduced. The silicide layer 108 may include cobalt silicide, titanium silicide, tantalum silicide, nickel silicide, tungsten silicide, platinum silicide, palladium silicide and so on.

The silicide layers 108 may have pillar shapes that upwardly protrude from the buried gates BG and the isolation layers 102 corresponding to the active region 103 between the buried gates BG. The silicide layer 108 having a pillar shape upwardly protruding from the buried gates BG and the isolation layers 102 may function as a plug, for example, a landing plug, to provide an electrical contact with the underlying impurity regions 107.

The pillar shape of the silicide layer 108 may have sidewalls having vertical profiles. For example, as illustrated in the specific example in FIG. 3C, the pillar shape of the silicide layer 108 may have upright or inclined sidewalls. Implementation example 1 and modification example 1 of FIG. 3C show the upright sidewalls of the silicide layer 183 while the examples in the lower part of the FIG. 3C show the inclined sidewalls the silicide layer 183. The silicide layer 108 may be configured to fully cover the impurity region 107 (refer to an implementation 1 of FIG. 3c) or to partially cover the impurity region 107 (refer to a modification example 1 of FIG. 3c). If the silicide layer 108 fully covers the impurity region 107, the silicide layer 108 may have the same critical dimension as the impurity region 107. If the silicide layer 108 partially covers the impurity region 107, the silicide layer 108 may have a smaller critical dimension than the impurity region 107. Modification examples 2 and 3 show the inclined sidewalls of the silicide layer 108 having a pillar shape, each sidewall have a smaller top critical dimension than a bottom critical dimension. The silicide layer 108 may be configured to fully cover the impurity region 107 (refer to a modification example 2 of FIG. 3C) or to partially cover the impurity region 107 (refer to a modification example 3 of FIG. 3C). If the silicide layer 108 has inclined sidewalls whose top critical dimension is smaller than a bottom critical dimension, a contact area between the silicide layer 108 and the contact plugs 109 can be effectively increased.

The semiconductor device having the silicide layers 108 that upwardly protrude from the buried gates BG may effectively reduce contact resistance. Furthermore, the semiconductor device can increase stability, a process margin for the silicide layers 108, and a process margin for misalignment, which accomplishes an easy and simple fabrication process of the contact plugs 109.

The disclosed buried gates in this document can be applied to various electronic devices, including an electronic device for storing data or information using a characteristic in which the electronic device switches between different resistance states in response to voltage or a current. Such storage devices can be used in various electronic devices or systems, such as computers and mobile communication devices, as described below in an example of a semiconductor device with reference to FIG. 4.

Figure 4:
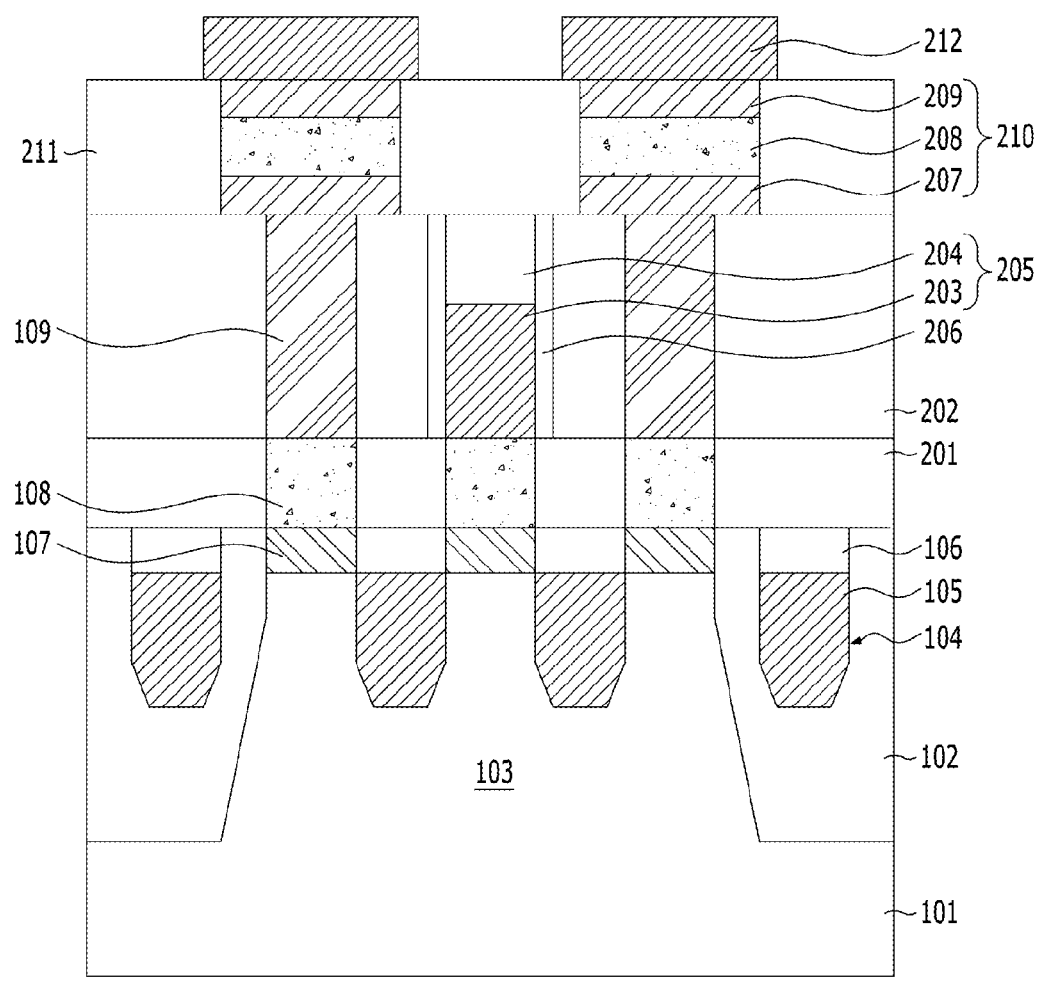
FIG. 4 is a cross-sectional view of an example of a semiconductor device for storing information.

FIG. 4 is a cross-sectional view of a semiconductor device for storing information based on the buried gates having protruded structures in FIG. 3B.

As shown in FIG. 4, a plurality of buried gates BG are formed in a substrate 101 in which a plurality of active regions 103 are defined by isolation layers 102. Impurity regions 107 are formed in the substrate 101 of the active region 103 between the buried gates BG. Each of the buried gates BG may include a trench 104, a gate insulating layer (not shown), a gate electrode 105, and a sealing layer 106 that are sequentially arranged in the substrate 101. A gate electrode 105 may be configured to bury part of the trench 104, and a sealing layer 106 may be configured to bury the remaining trench 104. The buried gate BG may have a line pattern extending along one direction and function as a word line.

Silicide layers 108 upwardly protruding from the buried gates BG and the isolation layers 102 are formed on the impurity regions 107. The silicide layers 108 may be configured to penetrate a first interlayer insulating layer 201. The silicide layer 108 may have a pillar shape whose sidewalls have vertical profiles. For example, the pillar shape of the silicide layer 108 may have inclined sidewalls whose top critical dimension is smaller than a bottom critical dimension. The silicide layer 108 may be configured to fully cover the impurity region 107 or to partially cover the impurity region 107.

A second interlayer insulating layer 202 is formed on the first interlayer insulating layer 201, and first conductive lines 205 and contact plugs 109 are formed in the second interlayer insulating layer 202. The first conductive lines 205 may extend in a direction that crosses a direction in which the buried gates BG extend. The first conductive line 205 may be formed in the silicide layer 108 formed in the center of the active region 103, and the first conductive line 205 may function as a source line. The first conductive line 205 may have a stack structure of a conductive layer 203 and an insulating layer 204. Spacers 206 may be formed along the sidewalls of the first conductive line 205. The contact plugs 109 may be configured to penetrate the second interlayer insulating layer 202 and be coupled with the silicide layers 108 at the edges of the active region 103.

Variable resistance elements 210 coupled with the contact plugs 109 and a third interlayer insulating layer 211 buried or disposed adjacent to the variable resistance elements 210 are formed on the second interlayer insulating layer 202. Each of the variable resistance elements 210 may have a stack structure of a first electrode 207, a variable resistance layer 208, and a second electrode 209. The variable resistance element 210 may have a characteristic in which the variable resistance element 210 switches between different resistance states (or different resistance values) in response to a bias (for example, voltage or a current) that is applied through the first electrode 207 or the second electrode 209 or both. Such a characteristic may be used in various fields. For example, the variable resistance element 210 may be used as data storage for storing data.

The variable resistance layer 208 has a variable resistance characteristic in response to a bias applied through the first electrode 207 or the second electrode 209 or both and may include a single layer or multiple layers. For example, the variable resistance layer 208 may include phase-change materials. The phase-change materials may include a chalcogen compound. The phase-change materials have a crystalline state changed into an amorphous state or a crystal state in response to an external stimulus (for example, voltage or a current) and may have a characteristic in which the phase-change materials switch between different resistance states. Furthermore, the variable resistance layer 208 may include metal oxide. The metal oxide may include transition metal oxide (TMO) or oxide based on perovskite or the like. The metal oxide includes intra-film vacancies and may have a characteristic in which the metal oxide switches between different resistance states depending on the creation and distinction of a conductive path according to the behavior of the vacancies in response to an external stimulus. Furthermore, the variable resistance layer 208 may include a stack layer in which a tunnel barrier layer is interposed between two magnetic material layers. The stack layer having the tunnel barrier layer interposed between the two magnetic material layers is also called a magnetic tunnel junction (MTJ). The stack layer having the tunnel barrier layer interposed between the two magnetic material layers may have a characteristic in which the stack layer switches different resistance states depending on magnetization directions of the two magnetic material layers. For example, if the two magnetic material layers have the same magnetization direction (or have parallel magnetization directions), the two magnetic material layers may have a low-resistance state. If the two magnetic material layers have different magnetization directions (or do not have parallel magnetization directions), the two magnetic material layers may have a high-resistance state. The above MTJ structure is one of various implementations for achieving a variable resistance characteristic in which the variable resistance layer 208 may switch between different resistance states in response to a bias applied to the first electrode 207 or the second electrode 209 or both. Other implementations are possible.

Second conductive lines 212 coupled with the variable resistance elements 210 may be formed on the third interlayer insulating layer 211. The second conductive lines 212 may extend in a direction that intersects the direction in which the buried gates BG extend and may function as bit lines.

The semiconductor device having the silicide layers 108 upwardly protruding from the isolation layers 102 and the buried gates BG may effectively reduce contact resistance of a device. If the present implementation is applied to an electronic device including the variable resistance elements 210 that essentially requires low contact resistance, for example, a resistance memory device, operating characteristics may be greatly improved.

FIGS. 5a to 5e are diagrams showing an example of a method for manufacturing a semiconductor device including buried gates. FIGS. 5a to 5e illustrate examples in which a semiconductor device having the structure of FIG. 3b is formed and are process-perspective views of sections taken along line A-A' of FIG. 3a.

Figure 5A:
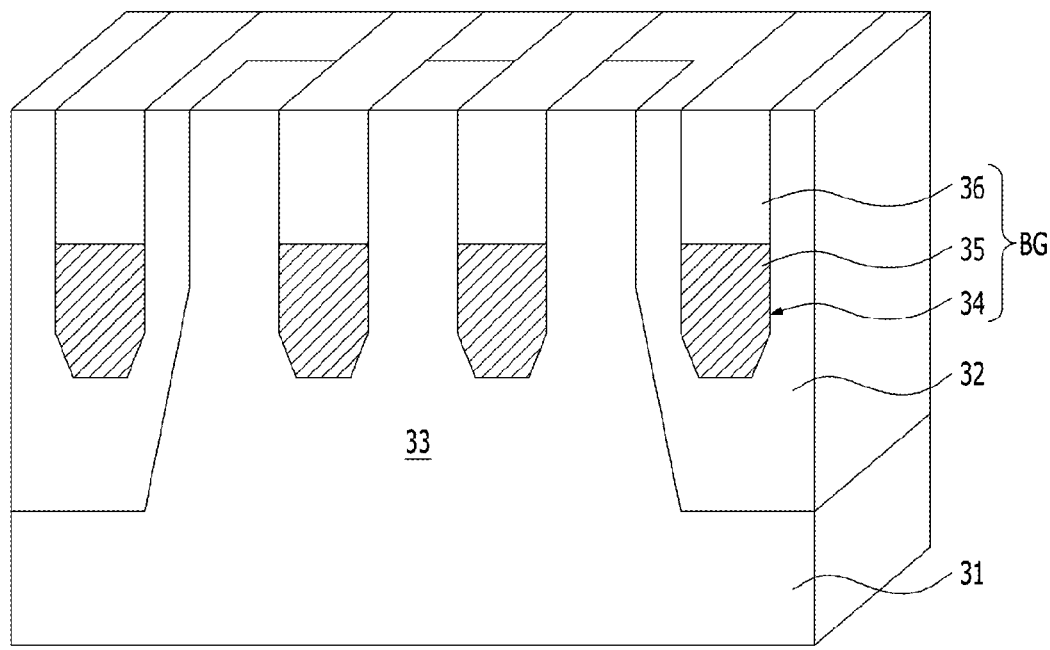
FIGS. 5A to 5E are diagrams showing an example of a method for manufacturing a semiconductor device including buried gates.

As shown in FIG. 5a, isolation layers 32 that define a plurality of active regions 33 are formed in a substrate 31. The substrate 31 may include silicon-containing materials. For example, the substrate 31 may be a bulk silicon substrate, a silicon germanium substrate, a support substrate, or an SOI substrate in which a buried insulating layer and an Si Epi. layer are stacked. The isolation layers 32 may be formed by a shallow trench isolation (STI) process and may include an insulating layer. For example, the isolation layers 32 may be any single layer or a stack layer of two or more layers including oxide layer, a nitride layer, and an oxide nitride layer. For example, the isolation layers 32 may be formed of a nitride layer. The active region 33 defined by the isolation layers 32 may have an obliquely extending shape having a long axis and a short axis.

After forming mask patterns (not shown) on the substrate 31 in which the isolation layers 32 are formed, a plurality of trenches 34 are formed by etching the substrate 31 using the mask patterns as etch barriers. The trench 34 may have a line type pattern that extends along a direction having an angle to a direction in which the long axis of the active region 33 extends. The trenches 34 may be formed to intersect both the active regions 33 and the isolation layers 32. The trenches 34 may include first trenches formed in the active regions 33 and second trenches formed in the isolation layers 32. The first trench and the second trench may have the same depth or the second trench may have a greater depth than the first trench due to a top surface of the substrate 31. If the depth of the second trench is greater than that of the first trench, since the bottom of the active region 33 has a fin shape, driving force (or a gate control capability) of the buried gate BG may be improved.

Gate insulating layers (not shown) are formed on surfaces of the trenches 34. The gate insulating layer may be formed of any single layer or a stack layer of two or more layers including oxide layer, a nitride layer, or an oxide nitride layer. For example, the gate insulating layer may be formed of an oxide layer, and the oxide layer may be formed by a thermal oxidization method or a radical oxidization method.

Conductive layers, each burying part of the trench 34, are formed on the gate insulating layers. The conductive layers function as gate electrodes 35. The gate electrode 35 may be formed of a silicon layer doped with impurities or a metallic layer. The gate electrodes 35, each partially burying the trench 34, may be formed by a series of processes for forming a gate conductive layer on the entire surface of the substrate 31 so that the trenches 34 are gap-filled and then sequentially performing a polishing process using a chemical mechanical polishing method and a blanket etching process using etchback.

Sealing layers 36, each filling the remaining trench 34, are formed on the gate electrodes 35. The sealing layer 36 functions to protect the gate electrode 35 in subsequent processes. The sealing layer 36 may be formed of any single layer or a stack layer of two or more layers including an oxide layer, a nitride layer, or an oxide nitride layer. The sealing layers 36 may be made of the same materials as the isolation layers 32, for the convenience of a subsequent process. For example, if the isolation layer 32 is formed of a nitride layer, the sealing layer 36 may also be formed of a nitride layer.

The sealing layers 36 may be formed by a series of processes for performing a polishing process until a surface of the substrate 31 is exposed after forming an insulating layer on the entire surface of the substrate 31 so that the trenches 34 are gap-filled. Here, the polishing process may be performed using a chemical mechanical polishing method or a blanket etch method or both.

Upon completion of the above processing, a plurality of buried gates BG can be formed in the substrate 31.

Figure 5B:
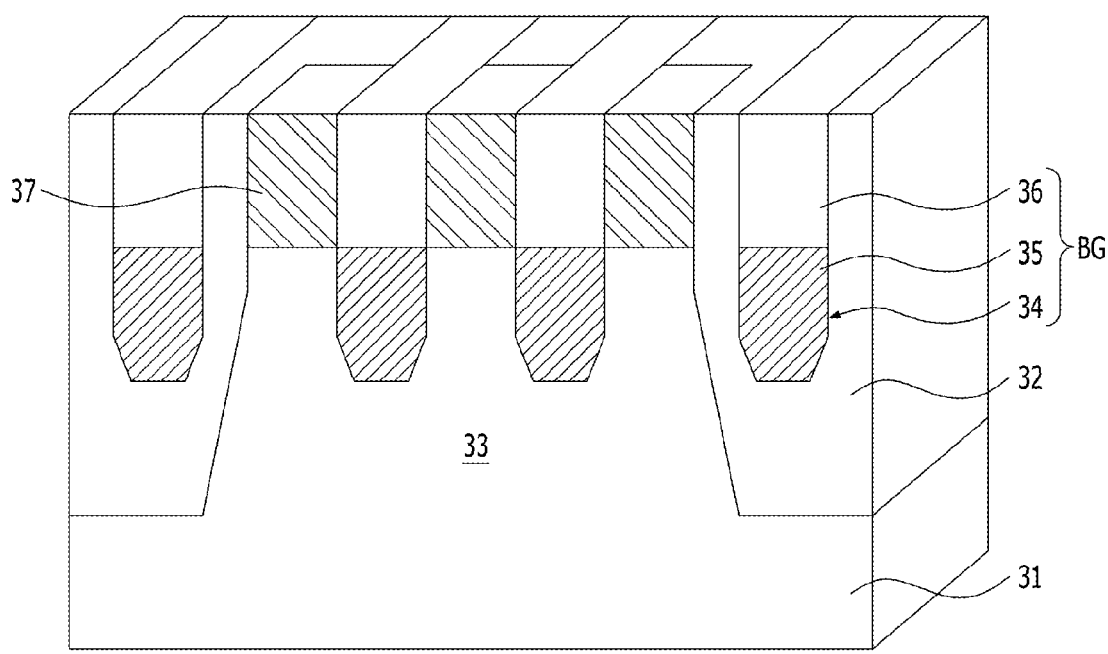

As shown in FIG. 5B, impurity regions 37 are formed in the active region 33 between the buried gates BG by implanting ion impurities into the substrate 31. The impurity region 37 functions as a junction region such as a source region/drain region. The depth of the impurity region 37 may be controlled using a top surface of the substrate 31 depending on the characteristics of a desired semiconductor device.

N-type impurities or P-type impurities may be used as the impurities for forming the impurity regions 37. The N-type impurities may include phosphorous (P) or arsenic (As), and the P-type impurities may include boron (B). In implementations of the disclosed technology, the type of impurities is not limited to the above examples, and various materials can be used as the impurities depending on the characteristics of a desired semiconductor device.

Figure 5C:
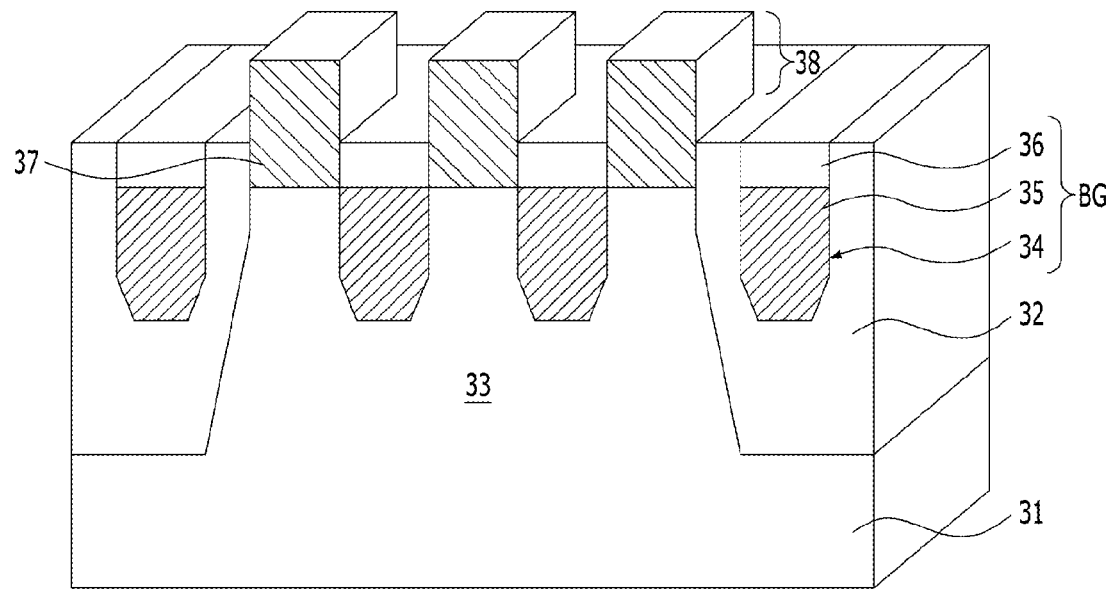

As shown in FIG. 5C, an etching process for projecting the impurity regions 37 between the buried gates BG upwardly from the buried gates BG and the isolation layers 32 may be performed by recessing the surrounding isolation layers 32 and the sealing layers 36. For example, the impurity regions 37 formed between the buried gates BG are projected upwardly from the buried gates BG and the isolation layers 32 by partially etching the isolation layers 32 and the sealing layers 36. The impurity regions 37 between the buried gates BG form a protruding part 38.

The protruding parts 38 may have a pillar shape which is formed on the impurity region 37 in the active region 33 between the buried gates BG. The etching process for forming the protruding parts 38 may be controlled such that a surface of the isolation layers 32 and a surface of the sealing layers 36 are placed on the same plane while the gate electrodes 35 are not exposed when the etching process is completed. By controlling the etching process in the above manner, the area of the protruding parts 38 can be uniformly formed.

The etching process for forming the protruding parts 38 may be performed using a dry etch method. The etching process may be performed by etching the isolation layers 32 and the sealing layers 36 at the same time (or at once) or independently. If the isolation layers 32 and the sealing layers 36 are made of the same materials, the etching process may be performed more easily, thereby uniformly forming the area of the protruding parts 38.

After performing the etching process for forming the protruding parts 38, an additional etching process may be performed for controlling shapes of the protruding parts 38. By controlling shapes of the protruding parts 38, a contact area between the protruding part 38 and a contact plug to be formed in a subsequent process can be increased, which allows to more effectively reduce contact resistance between the contact plug and the protruding part 38.

Figure 5D:
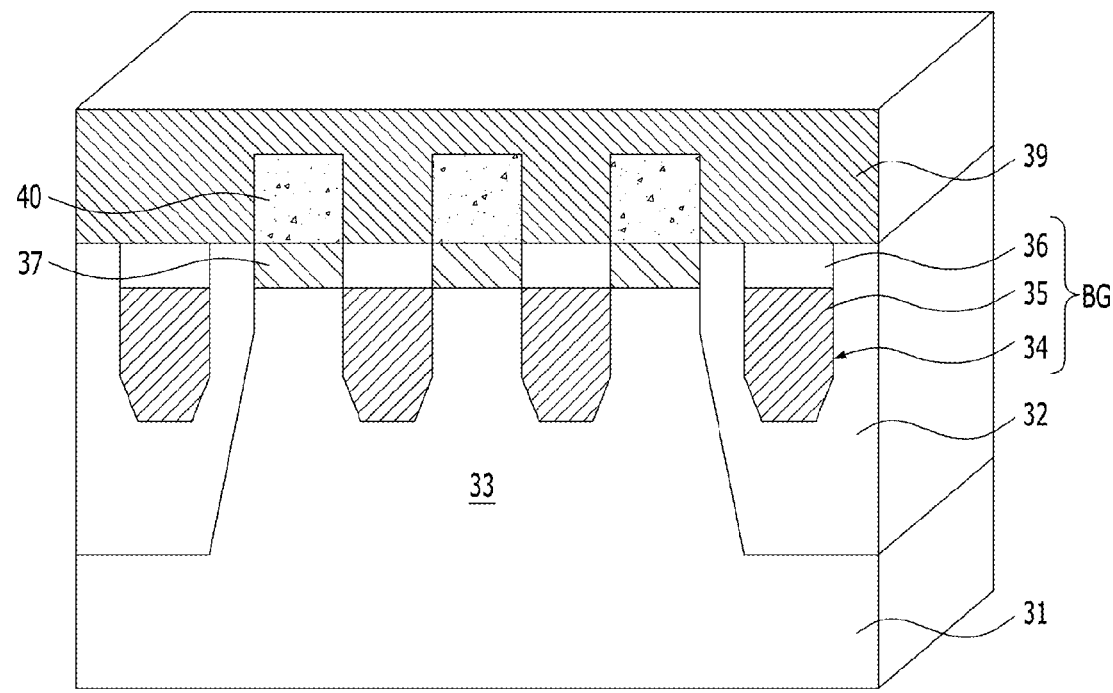

As shown in FIG. 5D, a metal-containing layer 39 is formed on the entire surface of the substrate 31 to cover the protruding parts 38, in contact with both the top and side surfaces of each protruding part 38, thus increasing the contact area and reducing the associated contact resistance. The metal-containing layer 39 is formed to have a thickness which allows to provide a sufficient metal source in the protruding part 38 to form silicide layers 40. The metal-containing layer 39 may include near-noble metal or refractory metal. For example, the metal-containing layer 39 may include cobalt (Co), titanium (Ti), tantalum (Ta), nickel (Ni), tungsten (W), platinum (Pt), or palladium (Pd).

A capping layer (not shown) may be formed on the metal-containing layer 39. The capping layer functions to prevent the oxidization of the metal-containing layer 39 in a subsequent annealing process and to activate a silicidation reaction. For example, the capping layer may be formed of a titanium nitride (TiN) layer.

Next, the silicide layers 40 are formed by reacting the protruding parts 38 with the metal-containing layer 39 through an annealing. The annealing may be rapid thermal anneal, and the silicide layers 40 may be formed by a fully-silicidation process. The fully-silicidation process refers to a process of silicidating all silicon-containing materials. All the protruding parts 38 are transformed into the silicide layers 40 through the annealing.

Figure 5E:
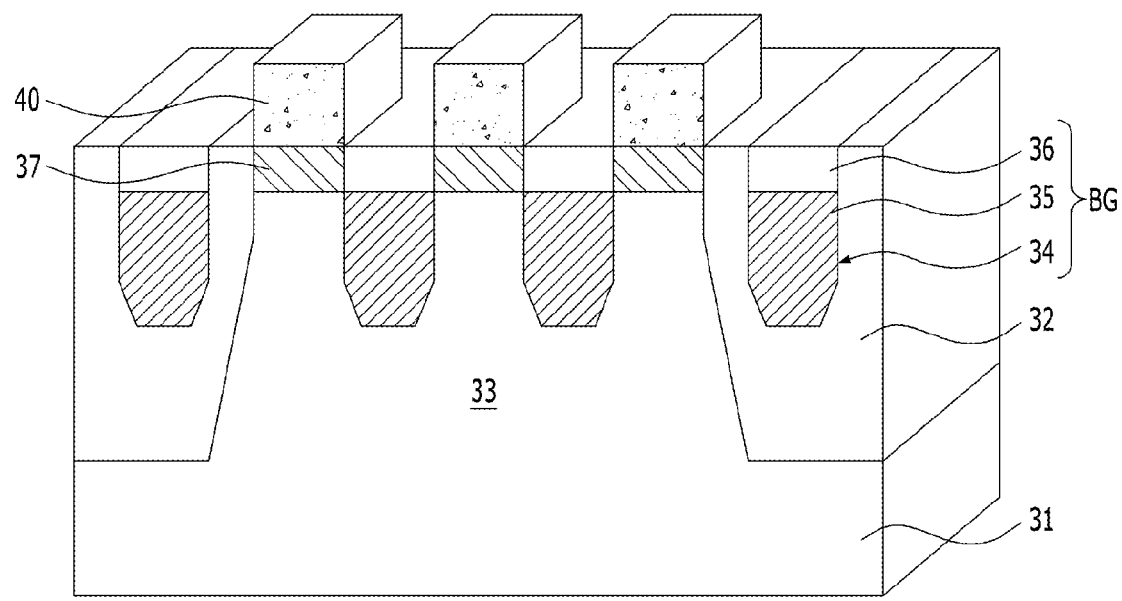

As shown in FIG. 5E, the metal-containing layer 39 remained after forming the silicide layers 40 is removed. The metal-containing layer 39 that has not reacted may be removed by wet etching.

In order to form the silicide layers 40, rapid thermal anneal (RTA) may be performed at least twice. For example, primary annealing and secondary annealing may be performed. The primary annealing may be performed under a temperature of 400 to 600° C., and the secondary anneal may be performed under a temperature of 600 to 800° C. The primary annealing may be used to form the silicide layers 40, and the secondary annealing may be used to transform the protruding parts 38 into the silicide layers 40 with low resistivity and stable crystal phases. The remaining metal-containing layer 39 that has not reacted may be removed between the primary annealing and the secondary annealing. The metal-containing layer 39 that has not reacted may be removed using a mixed chemical of sulphuric acid ($H_2SO_4$) and hydrogen peroxide ($H_2O_2$).

Next, although not shown, an interlayer insulating layer may be formed on the substrate 31 in which the silicide layers 40 are formed. Contact plugs in contact with the silicide layers 40 may be formed through the interlayer insulating layer. With the protruding silicide layer 40, a process margin for misalignment can be improved. Furthermore, if the additional etching process for controlling shapes of the protrusion parts 38 is performed, contact resistance between the silicide layer 40 and the contact plug can be more effectively reduced because a contact area between the silicide layer 40 and the contact plug is increased.

The semiconductor device may be provided using various semiconductor device fabrication techniques.

The protruding parts 38 are formed by projecting the substrate 31 upwardly from the isolation layers 32 and the buried gates BG, and the protruding parts 38 are transformed into the silicide layers 40. Accordingly, a contact area between the metal-containing layer 39 and the substrate 31 is significantly increased, which enables the silicide layers 40 to be stably formed. Further, contact resistance of a device can be effectively reduced although the degree of integration of semiconductor devices is increased.

As discussed above, the silicide layers are formed in the substrate between the buried gates and protrude upwardly from the buried gates. Accordingly, a process margin for forming the silicide layers can be improved, and thus, contact resistance can be effectively reduced in an electronic device including the buried gates.

The above and other memory circuits or semiconductor devices based on the disclosed technology may be used in a range of devices or systems. FIGS. 6-10 provide some examples of devices or systems that may implement the memory circuits disclosed herein.

Figure 6:
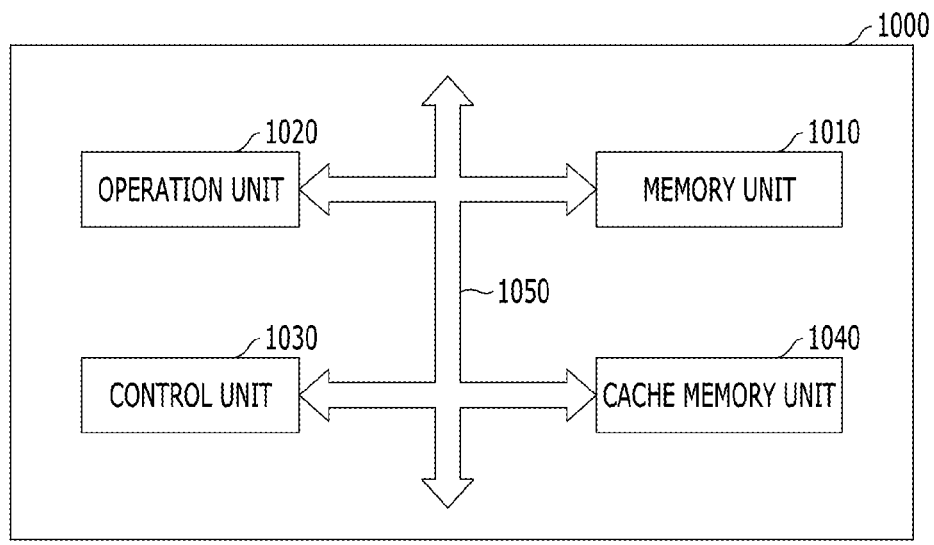
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of buried gates formed in a substrate; and silicide layers formed over the substrate between the buried gates and protruding upwardly from the buried gates. The silicide layers protruding upwardly from the buried gates can increase a process margin and reduce a contact resistance. Thus, signal transmission property of the memory unit 1010 and the microprocessor 1000 having the memory unit 1010 may be improved. As a consequence, a fabrication process of the microprocessor 1000 can become easier or simpler and the reliability of the microprocessor 1000 can be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
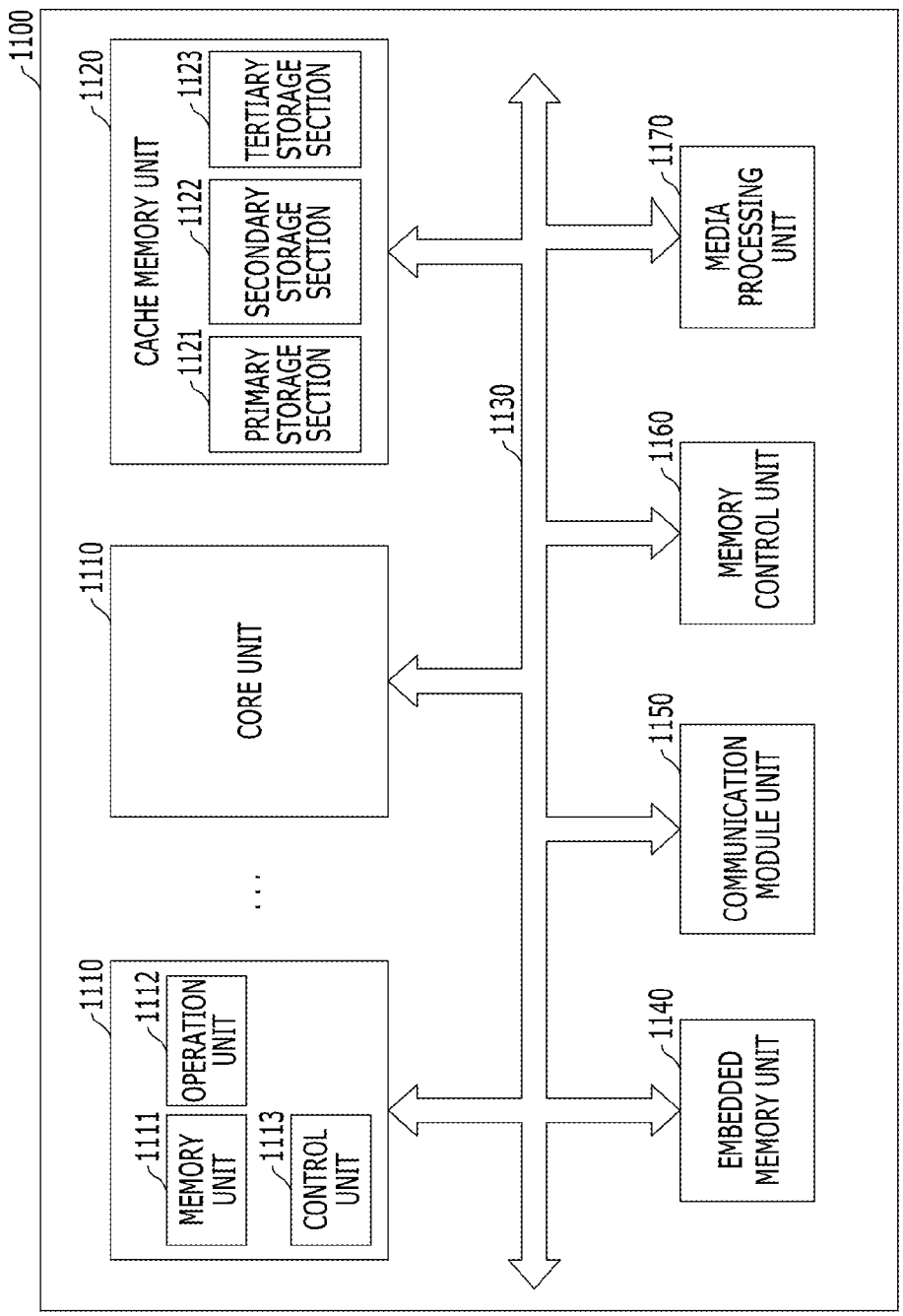
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of buried gates formed in a substrate; and silicide layers formed over the substrate between the buried gates and protruded upwardly from the buried gates. The silicide layers protruded upwardly from the buried gates increase a process margin and reduce a contact resistance. Through this, signal transmission property of the cache memory unit 1120 and the processor 1100 having the cache memory unit 1120 may be improved. As a consequence, a fabrication process of the microprocessor 1000 may become easy and the reliability of the microprocessor 1000 may be improved. Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which may transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
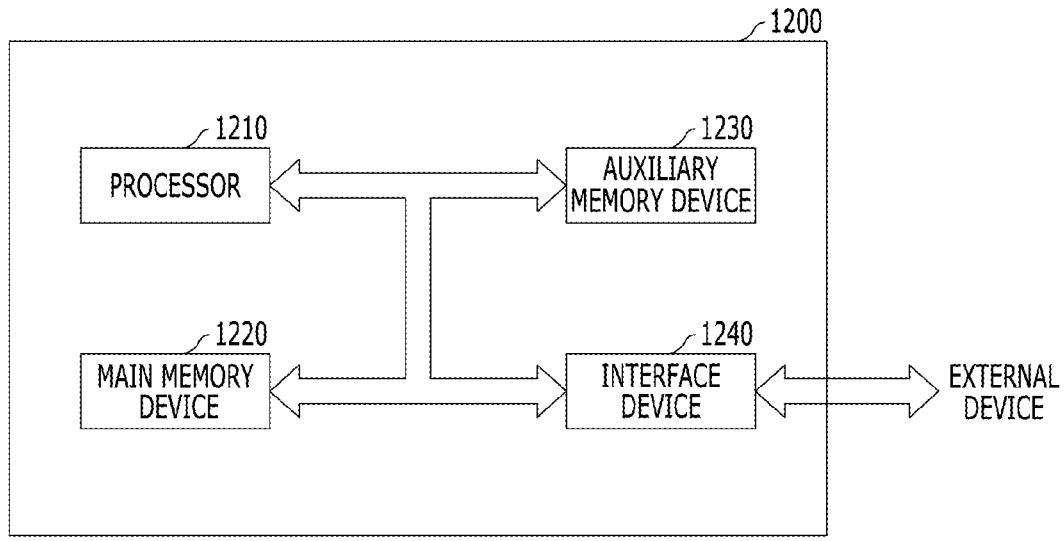
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and may conserve memorized contents even when power supply is cut off. The main memory device 1220 may include one or more of the above-described semiconductor devices in accordance with the implementations. For example, the main memory device 1220 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the main memory device 1220 may become easy and the reliability of the main memory device 1220 may be improved. As a consequence, a fabrication process of the system 1200 may become easy and the reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 may store a larger amount of data. The auxiliary memory device 1230 may include one or more of the above-described semiconductor devices in accordance with the implementations. For example, the auxiliary memory device 1230 may include a plurality of buried gates formed in a substrate; and silicide layers formed over the substrate between the buried gates and protruded upwardly from the buried gates. The silicide layers protruded upwardly from the buried gates increase a process margin and reduce a contact resistance. Through this, signal transmission property of the auxiliary memory device 1230 and the system 1200 having the auxiliary memory device 1230 may be improved. As a consequence, a fabrication process of the microprocessor 1000 may become easy and the reliability of the microprocessor 1000 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
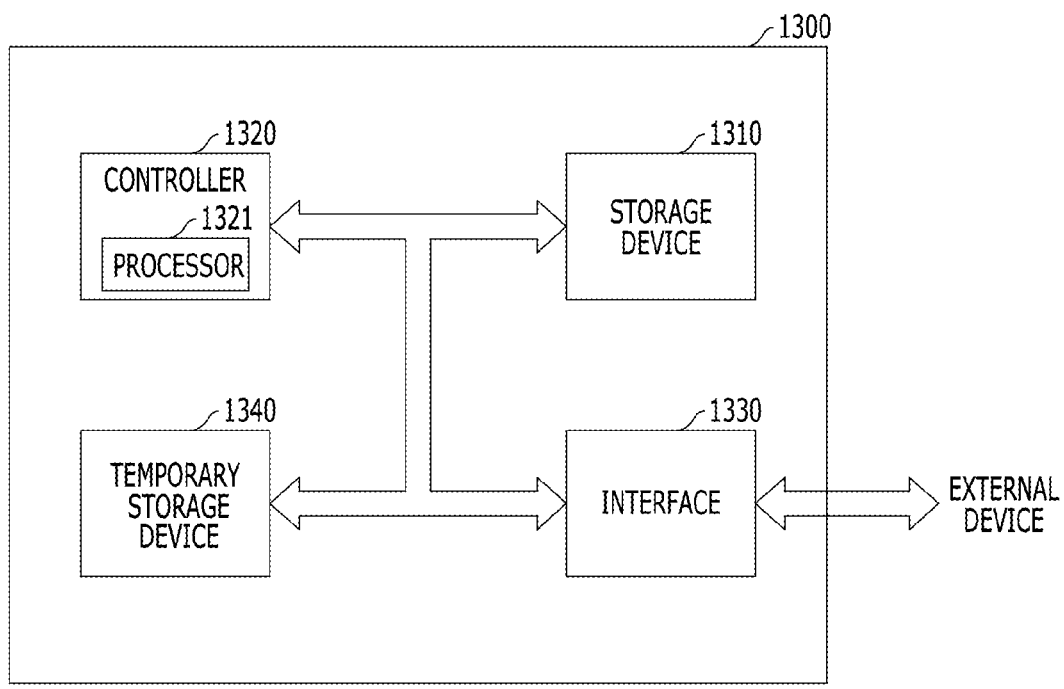
FIG. 9 is an example of configuration diagram of a data storage system implementing memory circuitry based on the disclosed technology.
Figure 10:
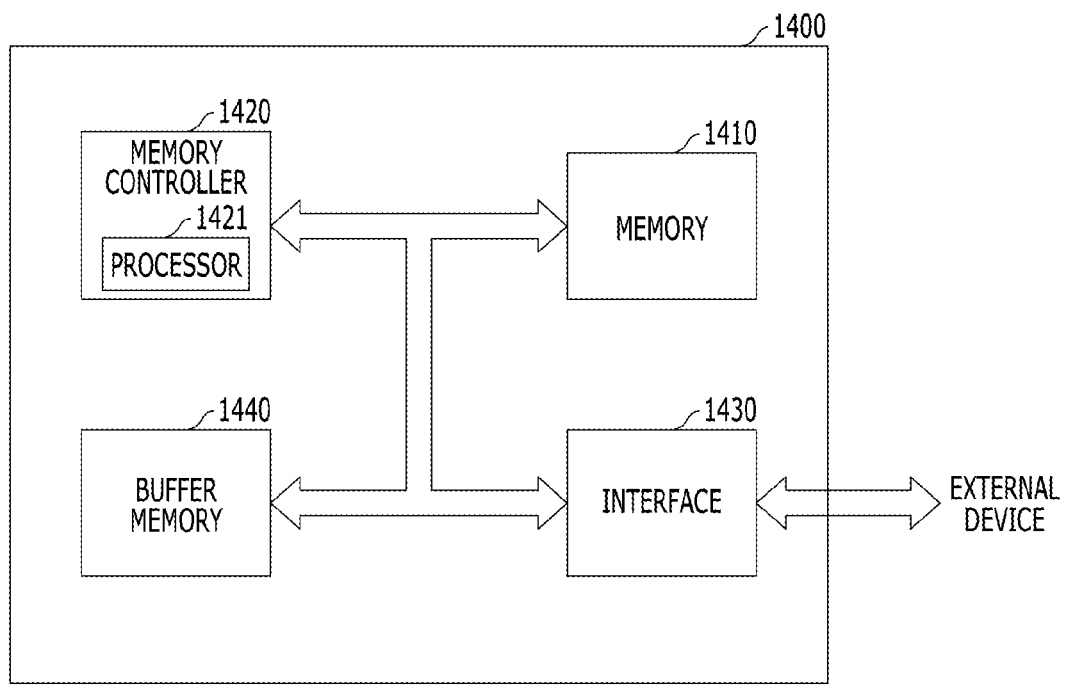
FIG. 10 is an example of configuration diagram of a memory system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 may store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The storage device 1310 or the temporary storage device 1340 may include a plurality of buried gates formed in a substrate; and silicide layers formed over the substrate between the buried gates and protruded upwardly from the buried gates. The silicide layers protruded upwardly from the buried gates increase a process margin and reduce a contact resistance. Through this, signal transmission property of The storage device 1310 or the temporary storage device 1340 and the data storage system 13300 having The storage device 1310 or the temporary storage device 1340 may be improved. As a consequence, a fabrication process of the microprocessor 1000 may become easy and the reliability of the microprocessor 1000 may be improved.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the memory 1410 may become easy and the reliability of the memory 1410 may be improved. As a consequence, a fabrication process of the memory system 1400 may become easy and the reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of buried gates formed in a substrate; and silicide layers formed over the substrate between the buried gates and protruded upwardly from the buried gates. The silicide layers protruded upwardly from the buried gates increase a process margin and reduce a contact resistance. Through this, signal transmission property of the buffer memory 1440 and the memory system 1400 having buffer memory 1440 may be improved. As a consequence, a fabrication process of the microprocessor 1000 may become easy and the reliability of the microprocessor 1000 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations may be made based on what is described and illustrated in this patent document.

What is claimed is:

1. A method for fabricating an electronic device having a semiconductor memory unit, comprising:
    forming isolation layers to define active regions in a substrate;
    forming a plurality of trenches in a substrate;
    forming gate electrodes, each burying each of the trenches;
    forming sealing layers, each burying the remaining trench;
    recessing the sealing layers and the isolation layers to produce protruding portions in the substrate of the active regions; and
    transforming the protruding portions into silicide layers.

2. The method of claim 1, after forming the sealing layers, further comprising:
    forming impurity regions in the active region between the sealing layers by implanting ion impurities into the substrate; and
    forming contact plugs to be in contact with the silicide layers.

3. The method of claim 1, wherein each of the silicide layers has a pillar shape having upright sidewalls or inclined sidewalls and wherein the inclined sidewalls provide a smaller top critical dimension of the pillar shape than a bottom critical dimension of the pillar shape.

4. The method of claim 3, further comprising selectively etching the protruding portions before transforming the protruding portions into the silicide layers.

5. The method of claim 1, wherein the sealing layers and the isolation layers are formed from the same material.

6. The method of claim 1, wherein the transforming of the protruding portions into the silicide layers comprises:
    forming a metal-containing layer to cover the protruding portion;
    performing annealing to transform the metal-containing layer and the protruding portions into the silicide layers and
    removing the metal-containing layer that has not reacted after the annealing.

7. The method of claim 1, wherein the forming of the plurality of trenches comprises:
    forming a plurality of trenches in the isolation layers; and
    forming a plurality of trenches in the active regions,
    wherein the depth of the trenches in the active regions is greater than that of the trenches in the isolation layers.

8. A method for fabricating an electronic device having a semiconductor memory unit, comprising:
    forming a plurality of buried gates inside trenches in a substrate having a plurality of active regions defined by isolation layers, each buried gate in each trench includes a gate electrode formed of a conductive material at least partially filling the trench and sealing layer formed on top of the gate electrode;
    forming impurity regions in the active regions between the buried gates by implanting ion impurities to the substrate such that portions of the impurity regions extend above the gate electrodes;
    etching the isolation layers and the sealing layers to produce protruding portions of the impurity regions between and above the gate electrodes, wherein the etching exposes top and side surfaces of the impurity regions thereby forming protruding parts having increased contact area; and
    transforming the protruding parts between the buried gates into silicide layers to provide electrical contact.

9. The method of claim 8, wherein the forming silicide layers further includes:
    forming a metal-containing layer on the surface of the substrate to cover the protruding parts; and
    reacting the protruding parts with the metal-containing layer to form silicide layers.

10. The method of claim 8, further comprising:
    forming an interlayer insulating layer; and
    forming contact plugs to be in contact with the silicide layers through the interlayer insulating layer.

11. The method of claim 8, further comprising, after the etching of the isolation layers and the sealing layers:
    performing an additional etching on the protruding parts to control shapes of the protruding parts.

12. The method of claim 11, wherein the performing of the additional etching is controlled such that the surface of the isolation layers and the surface of the sealing layers are placed on the same plane while the gate electrodes are not exposed when the etching is completed.

* * * * *